(12) United States Patent
Omizo et al.

(10) Patent No.: US 7,849,897 B2
(45) Date of Patent: Dec. 14, 2010

(54) APPARATUS AND METHOD FOR MANUFACTURING SEMICONDUCTOR DEVICE

(75) Inventors: Shoko Omizo, Kanagawa-ken (JP); Atsushi Yoshimura, Kanagawa-ken (JP); Mitsuhiro Nakao, Kanagawa-ken (JP); Junya Sagara, Kanagawa-ken (JP); Masayuki Dohi, Kanagawa-ken (JP); Tatsuhiko Shirakawa, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 664 days.

(21) Appl. No.: 11/892,638

(22) Filed: Aug. 24, 2007

(65) Prior Publication Data

US 2008/0110546 A1    May 15, 2008

(30) Foreign Application Priority Data

Aug. 25, 2006   (JP)   ............... 2006-228619

(51) Int. Cl.
*B32B 41/00*   (2006.01)

(52) U.S. Cl. ............... 156/360; 156/361; 156/362; 156/378; 156/379; 29/740; 29/741; 29/833; 29/834

(58) Field of Classification Search .......... 156/360, 156/361, 362, 378, 379; 29/833, 834, 740, 29/741

See application file for complete search history.

(56) References Cited

U.S. PATENT DOCUMENTS

| 6,571,465 B1 * | 6/2003 | Shirakawa .......... 29/832 |
| 2005/0081986 A1 | 4/2005 | Kwon et al. |

FOREIGN PATENT DOCUMENTS

| JP | 2000-252303 | 9/2000 |
| JP | 2005-123609 | 5/2005 |

* cited by examiner

*Primary Examiner*—George R Koch, III
(74) *Attorney, Agent, or Firm*—Finnegan, Henderson, Farabow, Garrett & Dunner, L.L.P.

(57) ABSTRACT

An apparatus for manufacturing a semiconductor device, includes: a collet; an alignment stage; and a sheet feeding mechanism. The collet is configured to suck a surface of a semiconductor chip. The surface is on opposite side of a bonding surface to be bonded to a bonding target. The bonding surface is provided with a film-like adhesive layer. The collet includes a heater for heating the adhesive layer. The alignment stage is configured to support the semiconductor chip and to correct position of the semiconductor chip. The sheet feeding mechanism is configured to feed a release sheet onto the alignment stage.

10 Claims, 5 Drawing Sheets

APPARATUS AND METHOD FOR MANUFACTURING SEMICONDUCTOR DEVICE

CROSS-REFERENCE TO RELATED APPLICATIONS

This application is based upon and claims the benefit of priority from the prior Japanese Patent Application No. 2006-228619, filed on Aug. 25, 2006; the entire contents of which are incorporated herein by reference.

BACKGROUND OF THE INVENTION

1. Field of the Invention

This invention relates to an apparatus and a method for manufacturing a semiconductor device.

2. Background Art

In a recently proposed technique for die bonding a semiconductor chip as an alternative to using a bonding liquid or paste, a film-like adhesive layer is provided on the backside of the semiconductor chip. A collet incorporating a heater is used to hold the semiconductor chip while heating its adhesive layer, thereby bonding the semiconductor chip via the adhesive layer to a bonding target (e.g., JP 2005-123609A). On the other hand, JP 2000-252303A discloses bonding a semiconductor chip retrieved from a wafer stage to a bonding target after position correction on a precisor (alignment stage).

From the viewpoint of reducing the index time required for die bonding after completing the position correction of a semiconductor chip on the precisor, it is desirable to pick up the semiconductor chip from the precisor while heating the adhesive layer on the backside of the semiconductor chip using a collet incorporating a heater. However, at this time, the adhesive layer is softened or melted by this heating, and part of the adhesive layer may remain on the precisor when the semiconductor chip is lifted from the precisor. If the adhesive layer remains attached onto the precisor, the remaining adhesive layer is attached to a subsequent semiconductor chip. Thus the semiconductor chip may be placed on the precisor in a floating or tilted position. This causes degradation in position recognition accuracy, failure in pickup from the precisor, and failure in bonding to the bonding target.

SUMMARY OF THE INVENTION

According to an aspect of the invention, there is provided an apparatus for manufacturing a semiconductor device, including: a collet configured to suck a surface of a semiconductor chip, the surface being on opposite side of a bonding surface to be bonded to a bonding target, the bonding surface being provided with a film-like adhesive layer, the collet including a heater for heating the adhesive layer; an alignment stage configured to support the semiconductor chip and to correct position of the semiconductor chip; and a sheet feeding mechanism configured to feed a release sheet onto the alignment stage.

According to another aspect of the invention, there is provided a method for manufacturing a semiconductor device, including: performing position correction of a semiconductor chip having a film-like adhesive layer on a bonding surface to be bonded to a bonding target with the adhesive layer of the semiconductor chip being stuck on a release sheet supported on an alignment stage; using a collet including a heater configured to heat the adhesive layer to suck a surface of the semiconductor chip on opposite side of the bonding surface for peeling the adhesive layer from the release sheet while heating the adhesive layer by the collet; and moving the semiconductor chip peeled from the release sheet to the bonding target and pressing the heated adhesive layer to the bonding target to bond the semiconductor chip to the bonding target.

DETAILED DESCRIPTION OF THE INVENTION

Figure 5:
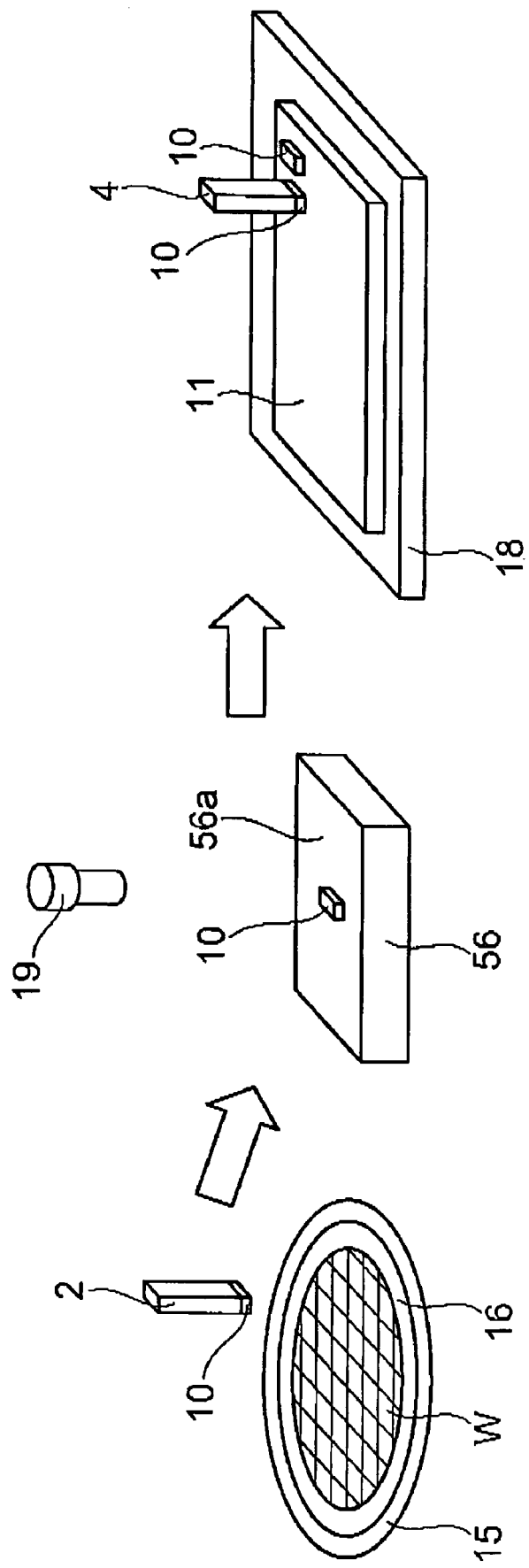
FIG. 5 is a schematic view showing the configuration of an apparatus for manufacturing a semiconductor device according to a comparative example.

FIG. 5 is a schematic, view showing the configuration of an apparatus for manufacturing a semiconductor device according to a comparative example investigated in the course of reaching the invention.

A semiconductor wafer W is stuck on a wafer tape 16 held by a frame 15. In this state, the semiconductor wafer W is cut vertically and horizontally into many semiconductor chips 10. A film-like adhesive layer is provided on the backside (bonding surface to a bonding target 11) of the semiconductor chips 10 in the form of a wafer. A pickup collet 2 vacuum chucks a surface of the individual semiconductor chip 10, the surface being on the opposite side of the bonding surface having the adhesive layer. The adhesive layer provided on the bonding surface of the semiconductor chip 10 is illustratively a tacky resin layer of thermosetting resin in the semi-cured state (stage B).

For example, when the wafer tape 16 is irradiated with ultraviolet radiation from its backside, the wafer tape 16 loses its tackiness, allowing the individual semiconductor chips 10 to easily peel from the wafer tape 16. Then the pickup collet 2 picks up the individual semiconductor chip 10 from the wafer tape 16 and transfers it onto an alignment stage 56. The semiconductor chip 10 is mounted on the alignment stage 56.

The semiconductor chip 10 is held on the alignment stage 56 illustratively by vacuum chuck and imaged by a camera 19. On the basis of this imaged data, the rotational position of the semiconductor chip 10 on the alignment stage 56 is recognized. When a desired rotational position (angle) is not achieved, the alignment stage 56 is rotated in the horizontal plane for rotational position correction (positioning) of the semiconductor chip 10.

Once the semiconductor chip 10 is correctly positioned, a bonding collet 4 vacuum chucks the surface of the semiconductor chip 10 opposite to the adhesive layer and transfers the semiconductor chip 10 to above the bonding target 11 supported on a bonding stage 18. Then the bonding collet 4 descends toward a desired die bonding site on the bonding target 11 and causes the adhesive layer of the semiconductor chip 10 to be pressed to the die bonding site. At this time, the bonding target 11 is heated by a heater provided in the bonding stage 18. The adhesive layer of the semiconductor chip 10 receives heat from the bonding target 11 and is heated to a desired temperature. Thus the adhesive layer is completely cured and bonded to the die bonding site.

According to this comparative example, for bonding a semiconductor chip 10 to a bonding target 11, it is necessary to heat the bonding target 11 via the bonding stage 18, to press the semiconductor chip 10 to the bonding target 11, and to wait until the adhesive layer receives heat from the bonding target 11 and is heated to a desired temperature. Thus the index time required for successively bonding semiconductor chips 10 to the bonding target 11 is lengthened.

To avoid lengthening the index time, a heater can be incorporated in the bonding collet 4 to start heating the semiconductor chip 10 at the time of pickup from the alignment stage 56. Then, however, the adhesive layer is softened or melted by this heating, and part of the adhesive layer may remain on the upper surface 56a of the alignment stage 56 when the semiconductor chip 10 is lifted from the alignment stage 56. If the adhesive layer remains attached to the alignment stage upper surface 56a, the remaining adhesive layer is attached to a subsequent semiconductor chip 10. Thus the semiconductor chip 10 may be placed on the alignment stage 56 in a floating or tilted position. This causes degradation in position recognition accuracy, failure in pickup from the alignment stage 56, and failure in bonding to the bonding target 11. Furthermore, it is troublesome to clean the vacuum suction hole of the alignment stage 56 clogged with the adhesive layer.

Thus, in the embodiments of the invention described below, the adverse effect of the adhesive layer remaining on the alignment stage is avoided with the index time reduced.

First Embodiment

Figure 1:
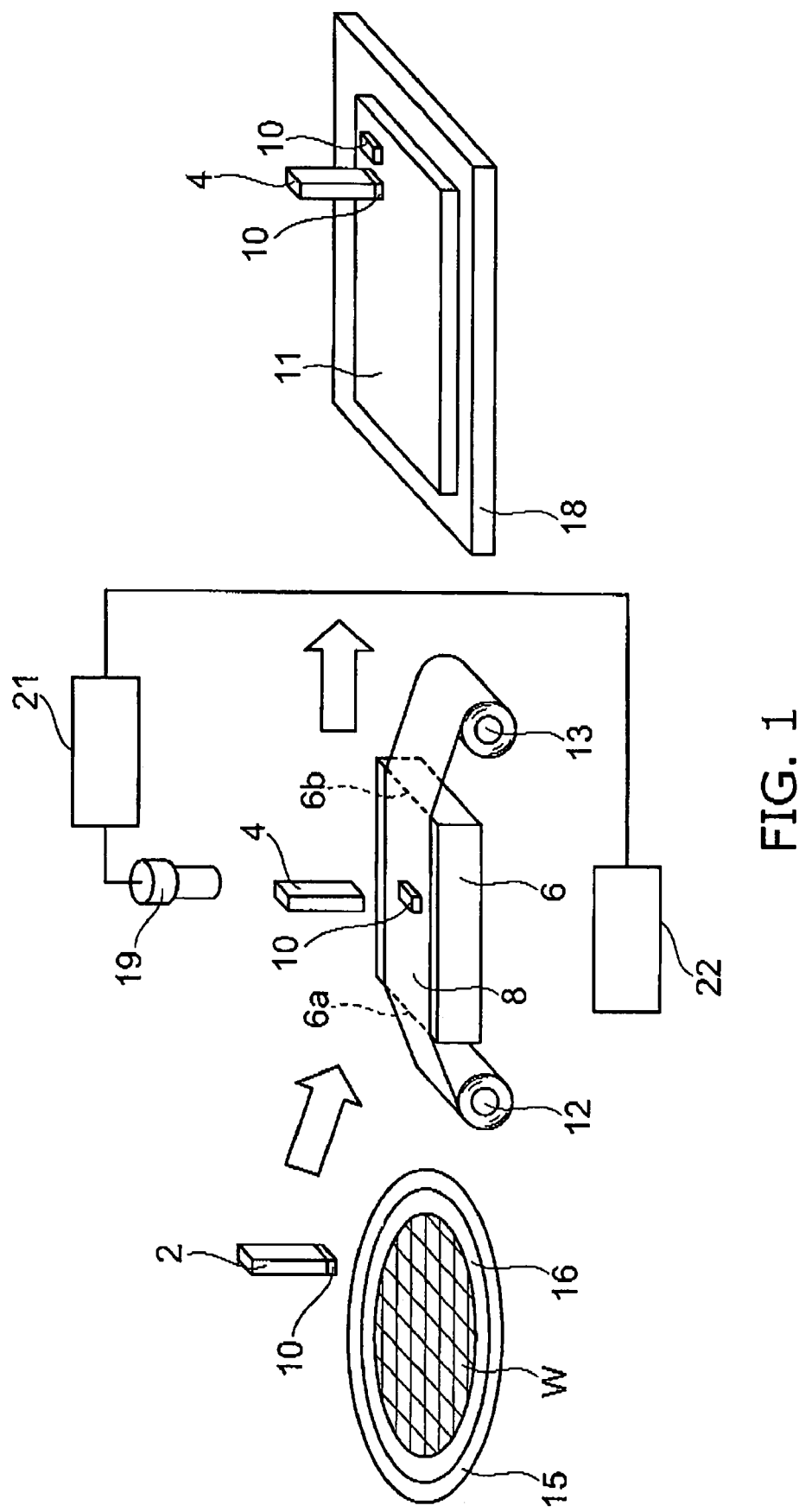
FIG. 1 is a schematic view showing the configuration of an apparatus for manufacturing a semiconductor device according to a first embodiment of the invention.

FIG. 1 is a schematic view showing the configuration of an apparatus for manufacturing a semiconductor device according to a first embodiment of the invention.

The apparatus for manufacturing a semiconductor device according to this embodiment primarily comprises a pickup collet 2 for picking up a semiconductor chip 10 from a wafer tape 16, position correction means for performing position correction (positioning) of the semiconductor chip 10 to enhance the positional accuracy in bonding the semiconductor chip 10 to a bonding target 11, and a bonding collet 4 for mounting the semiconductor chip 10 on the bonding target 11 for bonding (die bonding).

A semiconductor wafer W is stuck on the wafer tape 16 held by a frame 15. In this state, the semiconductor wafer W is cut vertically and horizontally into many semiconductor chips 10. A film-like adhesive layer is provided on the backside (bonding surface to the bonding target 11) of the semiconductor chips 10 in the form of a wafer. The pickup collet 2 vacuum chucks a surface of the individual semiconductor chip 10, the surface being on the opposite side of the bonding surface having the adhesive layer. The adhesive layer provided on the bonding surface of the semiconductor chip 10 is illustratively a tacky resin layer of thermosetting resin in the semi-cured state (stage B).

The position correction means includes an alignment stage (or also referred to as precisor) 6, a feed roller 12, a take-up roller 13, a camera 19, a processing unit 21 for processing the imaged data of the camera 19, and a driving unit 22 for rotating the alignment stage 6 in the horizontal plane.

The feed roller 12 and the take-up roller 13 constitute a sheet feeding mechanism for feeding a release sheet 8 on the alignment stage 6. One end of the release sheet 8 wound around the feed roller 12 is taken up by the take-up roller 13 so that the release sheet 8 fed from the feed roller 12 can travel on the alignment stage 6. The feed roller 12 and the take-up roller 13 are placed across the alignment stage 6. The feed roller 12 is placed upstream of the feed direction of the release sheet 8, and the take-up roller 13 is placed downstream of the feed direction of the release sheet 8.

The release sheet 8 has tackiness to the adhesive layer provided on the bonding surface of the semiconductor chip 10. After being stuck on the release sheet 8, the adhesive layer of the semiconductor chip 10 can be peeled from the release sheet 8 without application of heat or light, even over time. Furthermore, as described later, when the semiconductor chip 10 is peeled from the release sheet 8, the semiconductor chip 10 is heated by the bonding collet 4. Hence heat resistance to the heating temperature is required in the release sheet 8. Such a release sheet 8 can be illustratively made of fluorine resin or polyimide resin. Among them, fluorine resin is preferable, which has flexibility suitable for winding around the feed roller 12 and the take-up roller 13.

The camera 19 is placed above the alignment stage 6 and images the semiconductor chip 10 stuck on the release sheet 8 on the alignment stage 6. The processing unit 21 receiving the imaged data of the camera 19 recognizes the position of the semiconductor chip 10.

The bonding collet 4 has a vacuum chuck mechanism for sucking the surface of the semiconductor chip 10 on the opposite side of the adhesive layer, and incorporates a heater (not shown) for heating the adhesive layer.

The bonding target 11 such as a printed wiring board, an interposer substrate, or a lead frame is supported on the bonding stage 18. In a stacked structure including a plurality of stacked semiconductor chips, the bonding target is a semiconductor chip.

Bonding (die bonding) of the semiconductor chip 10 to the bonding target 11 is performed as follows using the apparatus described above with reference to FIG. 1.

For example, when the wafer tape 16 is irradiated with ultraviolet radiation from its backside, the wafer tape 16 loses its tackiness, allowing the individual semiconductor chips 10 to easily peel from the wafer tape 16. Then the pickup collet 2 picks up the individual semiconductor chip 10 from the wafer tape 16 and transfers it onto the alignment stage 6.

The release sheet 8 is supported on the alignment stage 6. The release sheet 8 is stretched between the rollers 12 and 13 under tension so as to bend slightly downward at the edge 6a on the feed roller 12 side and at the edge 6b on the take-up roller 13 side of the alignment stage 6, and stays at rest with being pressed on the upper surface of the alignment stage 6.

The pickup collet 2, suction holding the semiconductor chip 10 picked up from the wafer tape 16, descends from above the alignment stage 6, and sticks the adhesive layer of the semiconductor chip 10 on the release sheet 8. Then vacuum chucking in the pickup collet 2 is stopped, and suction holding of the semiconductor chip 10 is disabled. Thus the semiconductor chip 10 is supported on the alignment stage 6 with being stuck on the release sheet 8.

The semiconductor chip 10 supported on the alignment stage 6 is imaged by the camera 19. On the basis of this imaged data, the processing unit 21 recognizes the rotational position of the semiconductor chip 10 on the alignment stage 6. When a desired rotational position (angle) is not achieved, the driving unit 22 is used to rotate the alignment stage 6, along with the release sheet 8 and both the rollers 12, 13 wound therewith, in the horizontal plane for rotational position correction (positioning) of the semiconductor chip 10.

Whether the semiconductor chip 10 is correctly positioned at a desired position can be recognized on the basis of the imaged data of the camera 19. Once the semiconductor chip 10 is correctly positioned, the bonding collet 4 vacuum chucks the surface of the semiconductor chip 10 opposite to the adhesive layer and ascends as it is. Thus the adhesive layer of the semiconductor chip 10 is peeled from the release sheet 8 and disengaged from support on the alignment stage 6. During picking up the semiconductor chip 10, the bonding collet 4 activates the internal heater, and thereby starts heating the adhesive layer of the semiconductor chip 10.

The bonding collet 4 picks up the semiconductor chip 10 from the alignment stage 6 while heating the semiconductor chip 10, and transfers the semiconductor chip 10 to above the bonding target 11 while continuing heating. By the heating from the bonding collet 4, the adhesive layer of the semiconductor chip 10 is heated to e.g. approximately 100 to 200° C. In this state, the bonding collet 4 descends toward a desired die bonding site on the bonding target 11 and causes the adhesive layer of the semiconductor chip 10 to be pressed to the die bonding site. The adhesive layer of the semiconductor chip 10 pressed to the die bonding site with being heated to the above temperature is completely cured and bonded to the die bonding site.

Subsequently, vacuum chucking in the bonding collet 4 is stopped, and suction of the semiconductor chip 10 is disabled. The bonding collet 4 moves to above the alignment stage 6 in order to pick up another semiconductor chip 10 for die bonding from the alignment stage 6 as described above. The process of die bonding the semiconductor chip 10 is followed by a wire bonding process for bonding a chip surface electrode to interconnects and/or leads.

In this embodiment, for bonding a semiconductor chip 10 to a bonding target 11, a semi-cured adhesive layer provided in advance on the backside of the semiconductor chip 10 is heated and completely cured. In this embodiment, the heating of the adhesive layer is started by the heater incorporated in the bonding collet 4 at the time of picking up the semiconductor chip 10 from the alignment stage 6. This heating is continued while the semiconductor chip 10 is transferred to the bonding target 11, and directly the adhesive layer heated to a desired temperature is pressed to the bonding target 11. Thus, when the semiconductor chip 10 is pressed to the bonding target, the adhesive layer has already been softened or melted at a desired temperature.

According to this embodiment as described above, in contrast to the above comparative example, there is no need to heat the bonding target 11 via the bonding stage 18, to press the semiconductor chip 10 to the bonding target 11, and to wait until the adhesive layer receives heat from the bonding target 11 and is heated to a desired temperature. Hence, according to this embodiment, the index time required for successively bonding semiconductor chips 10 to the bonding target 11 can be reduced relative to the above comparative example, and the manufacturing efficiency can be improved.

In the case of heating the bonding target 11 via the bonding stage 18, portions other than the site to which the semiconductor chip 10 is about to be bonded are also heated. In contrast, in the present embodiment, only the semiconductor chip 10 is heated by the bonding collet 4. This serves for power saving, because the bonding target 11 having a larger area than the semiconductor chip 10 is not wastefully heated. Furthermore, the alignment stage 6 also needs no heating.

As described above, according to this embodiment, heating of the semiconductor chip 10 is started at the time of pickup from the alignment stage 6. Hence the adhesive layer is softened or melted by this heating, and part of the adhesive layer may remain on the release sheet 8 when the semiconductor chip 10 is lifted from the release sheet 8.

Thus, in this embodiment, after the semiconductor chip 10 is peeled from the release sheet 8, the take-up roller 13 is driven. Thus the used portion of the release sheet 8 is taken up by the take-up roller 13, and an unused portion of the release sheet 8 is fed onto the alignment stage 6 from the feed roller 12. Hence, even if part of the adhesive layer remains on the release sheet 8, the portion of the release sheet 8 is moved away from above the alignment stage 6. Therefore the remaining adhesive layer is not attached to a subsequent semiconductor chip 10. More specifically, it is possible to prevent degradation in position recognition accuracy, failure in pickup from the release sheet 8, and failure in bonding to the bonding target 11 due to the excess of the adhesive layer attached to the semiconductor chip 10, which may otherwise be placed on the release sheet 8 in a floating or tilted position. Furthermore, the adhesive layer of the semiconductor chip 10 is not in contact with the alignment stage 6, and hence the adhesive layer is not attached to the alignment stage 6. This saves the trouble of cleaning the alignment stage 6.

Moreover, at the time of positioning, the semiconductor chip 10 is firmly attached to the release sheet 8, which is stretched on the alignment stage 6 under tension between the feed roller 12 and the take-up roller 13. Hence even a semiconductor chip 10 that is particularly thin and susceptible to warpage can be supported on the alignment stage 6 with good planarity. Thus the position of the semiconductor chip 10 can be recognized with high accuracy. Consequently, the semiconductor chip 10 can be die bonded to the bonding target 11 with high positional accuracy. Furthermore, even if the semiconductor chip 10 is warped before positioning, the warpage can be rectified by sticking the semiconductor chip 10 on the release sheet 8 stretched on the alignment stage 6 under tension.

Other embodiments of the invention will be described in the following. Elements similar to those described above are marked with like reference numerals and are not described in detail.

Second Embodiment

Figure 2:
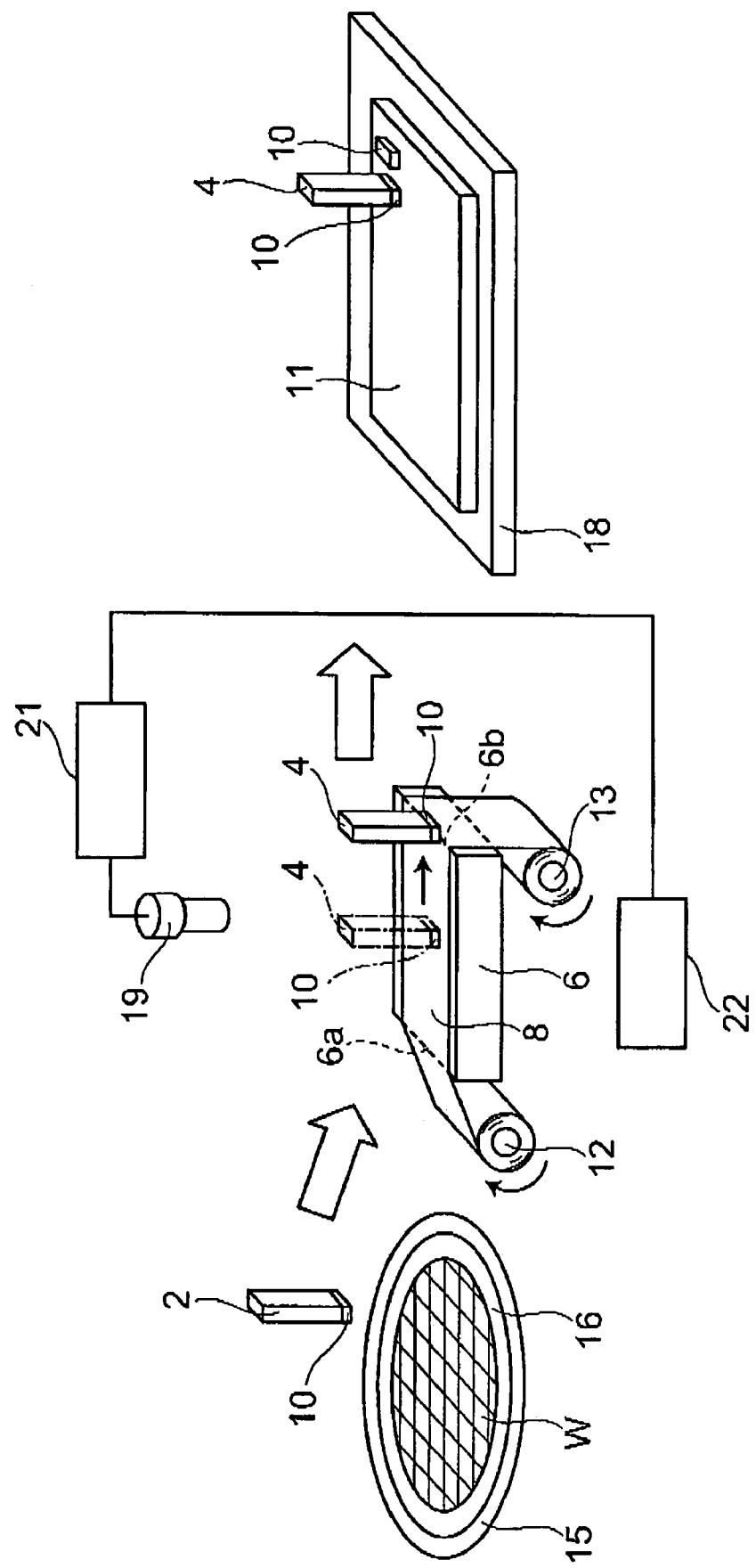
FIG. 2 is a schematic view showing the configuration of an apparatus for manufacturing a semiconductor device according to a second embodiment of the invention.

FIG. 2 is a schematic view showing the configuration of an apparatus for manufacturing a semiconductor device according to a second embodiment of the invention.

In this embodiment, the take-up roller 13 is placed below the vicinity of the edge 6b of the alignment stage 6 so that the release sheet 8 is bent generally at right angle at the edge 6b and pressed to the edge 6b.

After the positioning of the semiconductor chip 10 is completed, the bonding collet 4 sucks the semiconductor chip 10 still being stuck on the release sheet 8 as shown by the dot-dashed line in FIG. 2. At this time, the bonding collet 4 does not yet lift the semiconductor chip 10. Then the take-up roller 13 is driven so that the release sheet 8 travels on the alignment stage 6. Accordingly the semiconductor chip 10 and the bonding collet 4 are also moved from the position shown by the dot-dashed line to the right in FIG. 2.

By the travel of the release sheet 8 on the alignment stage 6, the semiconductor chip 10 stuck thereon is moved along with the bonding collet 4 to the edge 6b of the alignment stage 6 on the take-up roller 13 side. Further movement causes the semiconductor chip 10 to gradually disengage from the alignment stage 6, and then the release sheet 8 is taken up so as to bend downward at the edge 6b. Hence the release sheet 8 is gradually peeled from the adhesive layer of the semiconductor chip 10. When the semiconductor chip 10 is completely disengaged from the alignment stage 6, the semiconductor chip 10 is completely peeled from the release sheet 8. Even when the semiconductor chip 10 is disengaged from support on the alignment stage 6, the semiconductor chip 10 is suction held by the bonding collet 4 and directly transferred to the bonding target 11 for die bonding.

Thus, according to this embodiment, it is possible to easily peel the semiconductor chip 10 from the release sheet 8 by linearly moving the semiconductor chip 10 and the bonding collet 4 in concert with the travel of the release sheet 8 on the alignment stage 6. Hence no undue strain is placed on the semiconductor chip 10, and warpage and breakage of the semiconductor chip 10 can be prevented.

Third Embodiment

Figure 3:
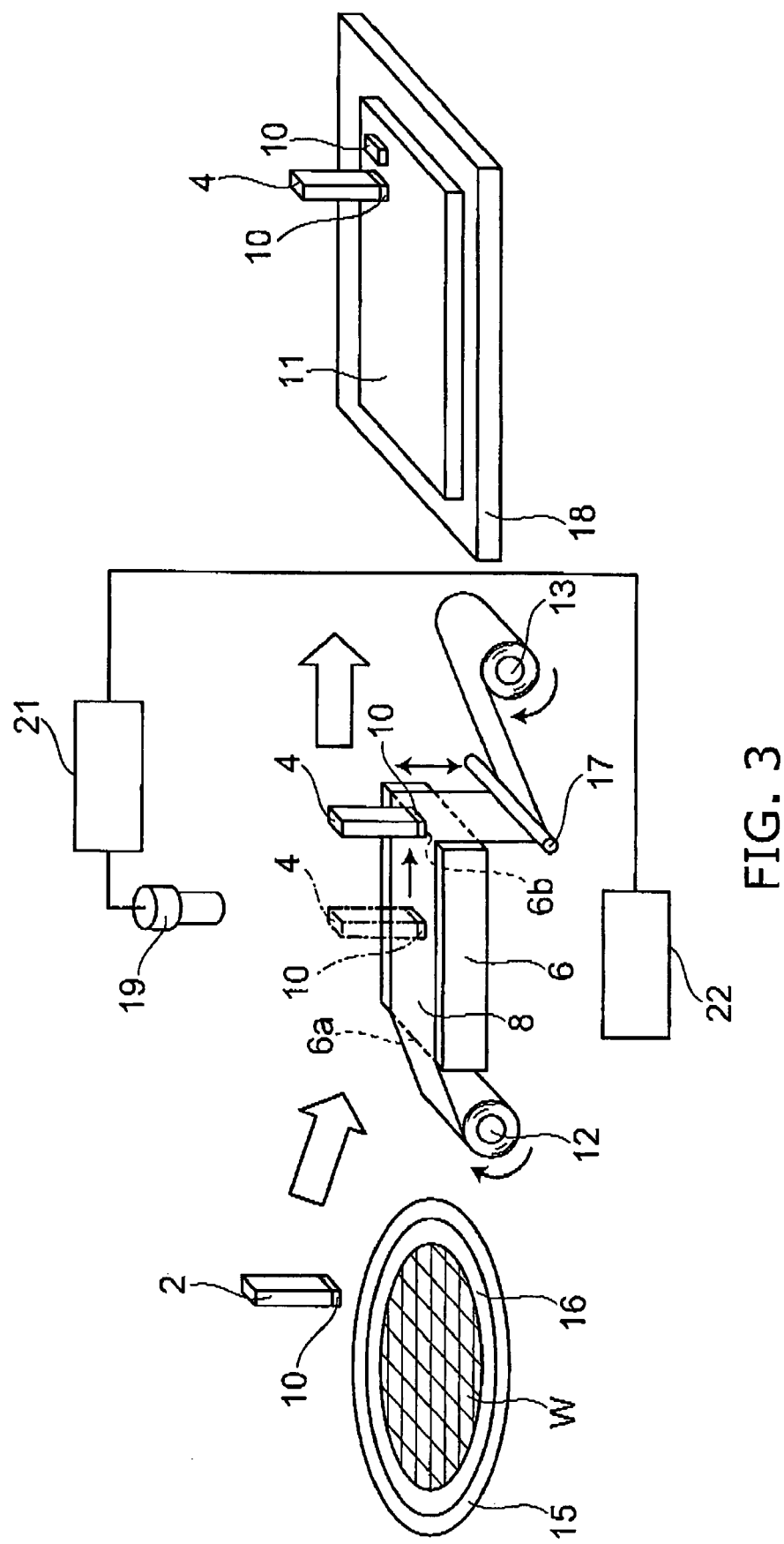
FIG. 3 is a schematic view showing the configuration of an apparatus for manufacturing a semiconductor device according to a third embodiment of the invention.

FIG. 3 is a schematic view showing the configuration of an apparatus for manufacturing a semiconductor device according to a third embodiment of the invention.

In this embodiment, a retaining member 17 is provided between the edge 6b of the alignment stage 6 on the take-up roller 13 side and the take-up roller 13 and above the release sheet 8. The retaining member 17 is shaped like a cylindrical bar extending along the width of the release sheet 8 (generally perpendicular to the feed direction). The retaining member 17 is vertically movable.

In this embodiment, the retaining member 17 is lowered to press and stretch downward the release sheet 8 downstream of the edge 6b in the direction of travel. Thus the release sheet 8 is bent downward at the edge 6b and pressed to the edge 6b.

Also in this embodiment, as in the second embodiment, after the positioning of the semiconductor chip 10 is completed, the bonding collet 4 sucks the semiconductor chip 10 still being stuck on the release sheet 8 as shown by the dot-dashed line in FIG. 3. At this time, the bonding collet 4 does not yet lift the semiconductor chip 10. Then the take-up roller 13 is driven so that the release sheet 8 travels on the alignment stage 6. Accordingly the semiconductor chip 10 and the bonding collet 4 are also moved from the position shown by the dot-dashed line to the right in FIG. 3.

By the travel of the release sheet 8 on the alignment stage 6, the semiconductor chip 10 stuck thereon is moved along with the bonding collet 4 to the edge 6b of the alignment stage 6 on the take-up roller 13 side. Further travel causes the semiconductor chip 10 to gradually disengage from the alignment stage 6, and then the release sheet 8 is taken up so as to bend downward at the edge 6b. Hence the release sheet 8 is gradually peeled from the adhesive layer of the semiconductor chip 10. When the semiconductor chip 10 is completely disengaged from the alignment stage 6, the semiconductor chip 10 is completely peeled from the release sheet 8. Even when the semiconductor chip 10 is disengaged from support on the alignment stage 6, the semiconductor chip 10 is suction held by the bonding collet 4 and directly transferred to the bonding target 11 for die bonding.

Also in this embodiment, it is possible to easily peel the semiconductor chip 10 from the release sheet 8 by linearly moving the semiconductor chip 10 and the bonding collet 4 in concert with the travel of the release sheet 8 on the alignment stage 6. Hence no undue strain is placed on the semiconductor chip 10, and warpage and breakage of the semiconductor chip 10 can be prevented.

Furthermore, the bending angle at the edge 6b and the tension of the release sheet 8 can be optimized by adjusting the descent position of the retaining member 17 depending on the material and thickness of the release sheet 8, the size of the semiconductor chip 10, and the material and thickness of the adhesive layer.

Fourth Embodiment

Figure 4:
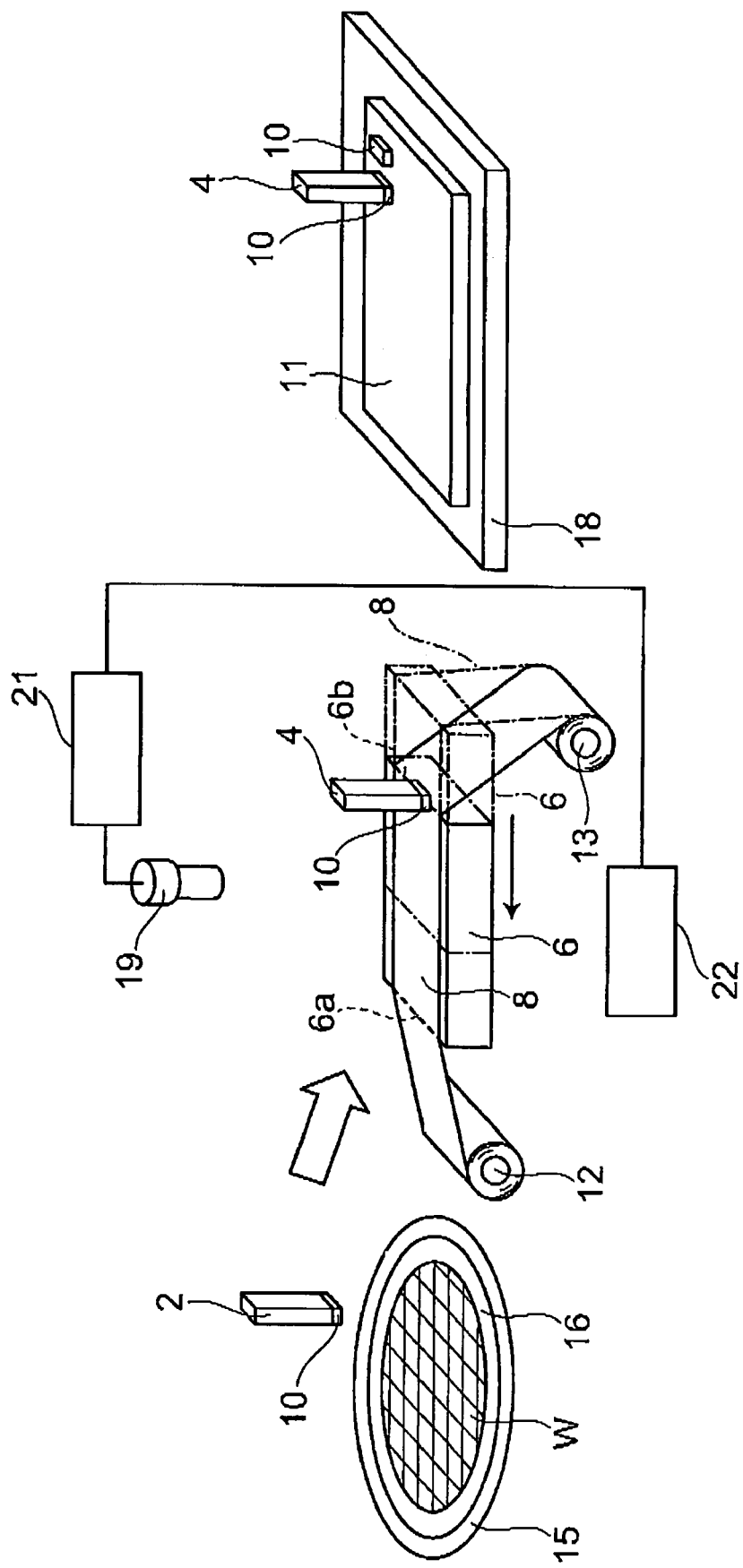
FIG. 4 is a schematic view showing the configuration of an apparatus for manufacturing a semiconductor device according to a fourth embodiment of the invention.

FIG. 4 is a schematic view showing the configuration of an apparatus for manufacturing a semiconductor device according to a fourth embodiment of the invention.

In this embodiment, the release sheet 8, the semiconductor chip 10 stuck thereon, and the bonding collet 4 for suction holding it are left at rest, whereas the alignment stage 6 is moved from the position shown by the dot-dashed line to the feed roller 12 side in FIG. 4.

More specifically, by the movement of the alignment stage 6, the semiconductor chip 10 is relatively moved along with the bonding collet 4 to the edge 6b of the alignment stage 6 on the take-up roller 13 side. Further movement causes the semiconductor chip 10 to gradually disengage from the alignment stage 6, and then the release sheet 8 is gradually peeled from the adhesive layer of the semiconductor chip 10. When the semiconductor chip 10 is completely disengaged from the alignment stage 6, the semiconductor chip 10 is completely peeled from the release sheet 8.

In this embodiment, the semiconductor chip 10 and the bonding collet 4 are linearly moved relative to the alignment stage 6. Hence the semiconductor chip 10 can be easily peeled from the release sheet 8, no undue strain is placed on the semiconductor chip 10, and warpage and breakage of the semiconductor chip 10 can be prevented.

The embodiments of the invention have been described with reference to examples. However, the invention is not limited thereto, but the embodiments can be variously modified within the spirit of the invention.

Position correction of the semiconductor chip 10 on the alignment stage 6 is not limited to correction of rotational position, but may include position correction in the x-y directions orthogonal to each other on the alignment stage 6. Furthermore, the release sheet 8 is not limited to the roll shape. For example, a planar release sheet may be successively fed and replaced on the alignment stage 6 using a robot arm.

The invention claimed is:

1. An apparatus for manufacturing a semiconductor device, comprising:
    a collet configured to suck a surface of a semiconductor chip, the surface being on an opposite side of a bonding surface to be bonded to a bonding target, the bonding surface being provided with a film-like adhesive layer, the collect including a heater for heating the adhesive layer;
    an alignment stage configured to support the semiconductor chip and to correct a position of the semiconductor chip;
    a sheet feeding mechanism configured to feed a release sheet onto the alignment stage and including a feed roller and a take-up roller, the feed roller and the take-up roller being configured to cause the release sheet to travel on the alignment stage; and
    a mechanism configured to cause relative movement between the release sheet and the alignment stage with the release sheet being pressed on an edge of the alignment stage on the take-up roller side.

2. The apparatus for manufacturing a semiconductor device according to claim 1, wherein the release sheet is stretched under a tension between the feed roller and the take-up roller and pressed on upper surface of the alignment stage.

3. The apparatus for manufacturing a semiconductor device according to claim 1, wherein the take-up roller takes up a used portion of the release sheet and the used portion of the release sheet is moved away from above the alignment stage.

4. The apparatus for manufacturing a semiconductor device according to claim 1, wherein the take-up roller is placed below a vicinity of the edge of the alignment stage and the release sheet is bent at the edge and pressed to the edge.

5. The apparatus for manufacturing a semiconductor device according to claim 1, further comprising a retaining member provided between the edge of the alignment stage on the take-up roller side and the take-up roller and above the release sheet, the retaining member being vertically movable, and the retaining member being lowered to bend the release sheet at the edge and to press the release sheet to the edge.

6. The apparatus for manufacturing a semiconductor device according to claim 1, further comprising:
   a camera provided above the alignment stage, the camera being configured to image the semiconductor chip stuck on the release sheet; and
   a driving unit configured to correct a position of the semiconductor chip by moving the alignment stage on a basis of image data of the camera.

7. An apparatus for manufacturing a semiconductor device, comprising:
   a collet configured to suck a surface of a semiconductor chip, the surface being on an opposite side of a bonding surface to be bonded to a bonding target, the bonding surface being provided with a film-like adhesive layer, the collet including a heater for heating the adhesive layer;
   an alignment stage configured to support the semiconductor chip and to correct a position of the semiconductor chip; and
   a sheet feeding mechanism configured to feed a release sheet onto the alignment stage, the release sheet having a tackiness to the adhesive layer of the semiconductor chip.

8. The apparatus for manufacturing a semiconductor device according to claim 7, wherein the release sheet is made of a thermosetting resin.

9. The apparatus for manufacturing a semiconductor device according to claim 7, wherein the release sheet is made of a fluorine resin.

10. The apparatus for manufacturing a semiconductor device according to claim 7, wherein the release sheet is made of a polyimide resin.

* * * * *